US012062559B2

(12) United States Patent
Matsuhashi et al.

(10) Patent No.: US 12,062,559 B2
(45) Date of Patent: Aug. 13, 2024

(54) SUBSTRATE PROCESSING SYSTEM, SUBSTRATE PROCESSING METHOD, AND CONTROL PROGRAM

(71) Applicant: TOKYO ELECTRON LIMITED, Tokyo (JP)

(72) Inventors: Takafumi Matsuhashi, Yamanashi (JP); Toshiharu Hirata, Yamanashi (JP); Minoru Nagasawa, Tokyo (JP); Kunio Takano, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 304 days.

(21) Appl. No.: 17/522,402

(22) Filed: Nov. 9, 2021

(65) Prior Publication Data
US 2022/0148898 A1    May 12, 2022

(30) Foreign Application Priority Data

Nov. 10, 2020    (JP) .................. 2020-186943

(51) Int. Cl.
*H01L 21/67* (2006.01)
*H01L 21/677* (2006.01)

(52) U.S. Cl.
CPC .. *H01L 21/67276* (2013.01); *H01L 21/67703* (2013.01); *H01L 21/67739* (2013.01)

(58) Field of Classification Search
CPC ......... H01L 21/67276; H01L 21/67703; H01L 21/67715; H01L 21/67739; H01L 21/67754; H01L 23/00
See application file for complete search history.

(56) References Cited

U.S. PATENT DOCUMENTS

| | | | |
|---|---|---|---|
| 6,834,210 B2 | 12/2004 | Tateyama et al. | |
| 11,127,615 B2 | 9/2021 | Matsuhashi et al. | |
| 11,177,147 B2 | 11/2021 | Mitsuya | |
| 2002/0076306 A1 | 6/2002 | Tateyama et al. | |

(Continued)

FOREIGN PATENT DOCUMENTS

| | | | |
|---|---|---|---|
| JP | 2002-184671 A | 6/2002 | |
| JP | 6160614 B2 | 7/2017 | |

(Continued)

*Primary Examiner* — Kidest Bahta
(74) *Attorney, Agent, or Firm* — Fenwick & West LLP

(57) ABSTRACT

A substrate processing system for performing processing on a plurality of substrates. The substrate processing system comprises: a processing unit comprising a plurality of processing modules each configured to perform a predetermined process; a transfer unit having a transfer device configured to transfer a substrate to each of the plurality of processing modules; a loading/unloading unit configured to hold a plurality of substrates and load/unload a substrate to/from the processing unit; and a controller configured to control the processing unit, the loading/unloading unit, and the transfer unit. The controller controls the transfer unit to transfer to the plurality of processing modules in a serial manner a plurality of substrates that are sequentially loaded from the loading/unloading unit to the processing unit, the controller further comprises a standby mode setting unit configured to set a standby period of the substrate at an appropriate timing depending on a content of the process.

12 Claims, 9 Drawing Sheets

(56) References Cited

U.S. PATENT DOCUMENTS

| | | | |
|---|---|---|---|
| 2011/0172800 A1* | 7/2011 | Koizumi | G06Q 10/06 |
| | | | 700/100 |
| 2014/0046470 A1* | 2/2014 | Nomura | H01L 21/67745 |
| | | | 700/109 |
| 2014/0121814 A1* | 5/2014 | Ogawa | G05B 19/41865 |
| | | | 700/121 |
| 2014/0161571 A1* | 6/2014 | Hiraide | H01L 21/67167 |
| | | | 414/217.1 |
| 2015/0243490 A1* | 8/2015 | Ryu | H01L 21/68771 |
| | | | 156/345.32 |
| 2019/0237350 A1 | 8/2019 | Mitsuya | |
| 2020/0013654 A1 | 1/2020 | Matsuhashi et al. | |

FOREIGN PATENT DOCUMENTS

| | | |
|---|---|---|
| JP | 2019-133998 A | 8/2019 |
| JP | 2020-009837 A | 1/2020 |
| KR | 10-2002-0046994 A | 6/2002 |
| KR | 10-2019-0092292 A | 8/2019 |
| KR | 10-2020-0004764 A | 1/2020 |

* cited by examiner

SUBSTRATE PROCESSING SYSTEM, SUBSTRATE PROCESSING METHOD, AND CONTROL PROGRAM

CROSS-REFERENCE TO RELATED APPLICATIONS

This application claims priority to Japanese Patent Application No. 2020-186943 filed on Nov. 10, 2020, the entire contents of which are incorporated herein by reference.

TECHNICAL FIELD

The present disclosure relates to a substrate processing system, a substrate processing method, and a control program.

BACKGROUND

It is suggested a substrate processing system for performing processing on a plurality of substrates, including a plurality of processing modules each configured to perform a predetermined process, and a transfer mechanism for transferring a substrate to the processing modules and configured to sequentially transfer the substrate from the processing modules in a serial manner (see, e.g., Japanese Patent No. 6160614). Further, Japanese Laid-open Patent Publication No. 2020-9837 suggests a substrate processing system for transferring substrates in a serial manner, in which an interval for unloading a substrate from a loading/unloading unit for loading/unloading a substrate to a processing unit having a plurality of processing modules is set to suppress non-uniformity of substrate processing results while suppressing the decrease of throughput.

SUMMARY

The present disclosure provides a technique capable of performing highly uniform processing on a plurality of substrates while sufficiently suppressing the decrease of throughput.

In accordance with an aspect of the present disclosure, there is provided a substrate processing system for performing processing on a plurality of substrates. The substrate processing system comprises: a processing unit comprising a plurality of processing modules each configured to perform a predetermined process; a transfer unit having a transfer device configured to transfer a substrate to each of the plurality of processing modules; a loading/unloading unit configured to hold a plurality of substrates and load/unload a substrate to/from the processing unit; and a controller configured to control the processing unit, the loading/unloading unit, and the transfer unit. The controller controls the transfer unit to transfer to the plurality of processing modules in a serial manner a plurality of substrates that are sequentially loaded from the loading/unloading unit to the processing unit, the controller further comprises a standby mode setting unit configured to set a standby period of the substrate at an appropriate timing depending on a content of the process.

BRIEF DESCRIPTION OF THE DRAWINGS

The objects and features of the present disclosure will become apparent from the following description of embodiments, given in conjunction with the accompanying drawings, in which.

DETAILED DESCRIPTION

Hereinafter, embodiments will be described with reference to the accompanying drawings.

Figure 1:
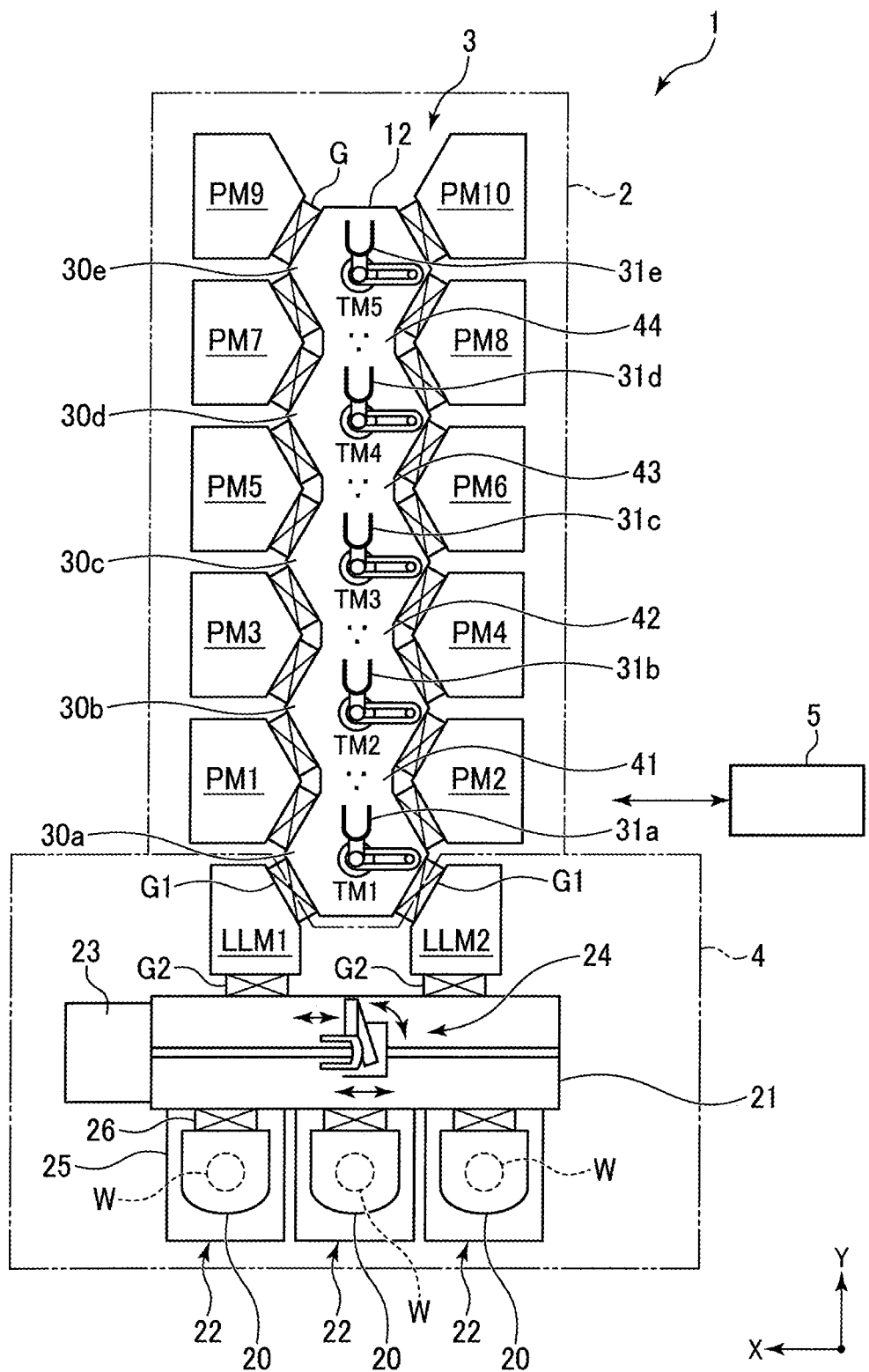
FIG. 1 is a schematic cross-sectional view showing a substrate processing system according to an embodiment.

FIG. 1 is a schematic cross-sectional view showing a substrate processing system according to an embodiment.

A substrate processing system 1 performs a plurality of processes on the substrate W, and comprises a processing unit 2, a transfer unit 3, a loading/unloading unit 4, and a controller 5. The substrate is, e.g., a semiconductor wafer, but is not particularly limited thereto.

The processing unit 2 has a plurality of processing modules PM1 to PM10 (in this example, 10) for performing vacuum processing onto the substrate W.

The transfer unit 3 sequentially transfers the substrate W to the plurality of processing modules PM1 to PM10. The transfer unit 3 includes a plurality of transfer modules TM1 to TM5. The transfer modules TM1 to TM5 respectively have containers 30a, 30b, 30c, 30d, and 30e having a hexagonal plane shape and maintained in a vacuum state, and articulated transfer devices 31a, 31b, 31c, 31d and 31e disposed in the respective containers. Delivery units 41, 42, 43, and 44 are disposed between the transfer devices of the transfer modules TM1 to TM5 as transfer buffers. The containers 30a, 30b, 30c, 30d, and 30e of the transfer modules TM1 to TM5 are connected to each other to form one transfer chamber 12. The transfer chamber 12 extends in a Y direction in the drawing, and five of the processing modules PM1 to PM10 are connected to one side of the transfer chamber 12 and the other five of the processing modules PM1 to PM10 are connected to the other side of the transfer chamber 12 through gate valves G that can be opened and closed. The gate valves G of the processing modules PM1 to PM10 are opened when the transfer module accesses the processing module, and are closed during processing.

The loading/unloading unit 4 is connected to one end of the processing unit 2. The loading/unloading unit 4 includes an atmospheric transfer chamber (EFEM) 21, three load ports 22 connected to the atmospheric transfer chamber 21, an aligner module 23, two load-lock modules LLM1 and LLM2, and an atmospheric transfer device 24 disposed in the atmospheric transfer chamber 21.

The atmospheric transfer chamber 21 has a rectangular parallelepiped shape with an X direction in the drawing as a longitudinal direction. The three load ports 22 are disposed on a long sidewall of the atmospheric transfer chamber 21 opposite to the processing unit 2. Each of the load ports 22 has a mounting table 25 and a transfer port 26. A FOUP 20 that is a substrate storage container accommodating a plurality of substrates is placed on the mounting table 25, and the FOUP 20 on the mounting table 25 is connected in a sealed state to the atmospheric transfer chamber 21 through the transfer port 26.

The aligner module 23 is connected to one short sidewall of the atmospheric transfer chamber 21. In the aligner module 23, the substrate W is aligned.

A pressure in each of the two load-lock modules LLM1 and LLM2 for transferring the substrate W between the atmospheric transfer chamber 21 having an atmospheric pressure and the transfer chamber 12 having a vacuum atmosphere can be switched between an atmospheric pressure and a vacuum level that is substantially the same as that in the transfer chamber 12. Each of the two load-lock modules LLM1 and LLM2 has two transfer ports. One transfer port is connected to the long sidewall of the atmospheric transfer chamber 21 facing the processing unit 2 through a gate valve G2. The other transfer port is connected to the transfer chamber 12 of the processing unit 2 through a gate valve G1. The load-lock module LLM1 is used for transferring the substrate W from the loading/unloading unit 4 to the processing unit 2, and the load-lock module LLM2 is used for transferring the substrate W from the processing unit 2 to the loading/unloading unit 4. The load-lock modules LLM1 and LLM2 may also be used for performing processes such as degassing or the like.

The atmospheric transfer device 24 in the atmospheric transfer chamber 21 has an articulated structure, and transfers the substrate W to the FOUP 20 on the load port 22, the aligner module 23, and the load-lock modules LLM1 and the LLM2. Specifically, the atmospheric transfer device 24 takes out an unprocessed substrate W from the FOUP 20 of the load port 22 and transfers it to the aligner module 23 and then to the load-lock module LLM1. Further, the atmospheric transfer device 24 receives a processed substrate W from the processing unit 2 transferred to the load-lock module LLM2 and then transfers the substrate W to the FOUP 20 of the load port 22. Although FIG. 1 shows an example in which the atmospheric transfer device 24 has one pick for receiving the substrate W, the atmospheric transfer device 24 may have two picks.

In the processing unit 2, the processing modules PM1, PM3, PM5, PM7, and PM9 are sequentially arranged from the load-lock module LLM1 side on one side of the transfer chamber 12, and the processing modules PM2, PM4, PM6, PM8, and PM10 are sequentially arranged from the load-lock module LLM2 side on the other side of the transfer chamber 12. Further, in the transfer unit 3, the transfer modules TM1, TM2, TM3, TM4, and TM5 are sequentially arranged from the load-lock modules LLM1 and LLM2 side.

The transfer mechanism 31a of the transfer module TM1 can access the load-lock modules LLM1 and LLM2, the processing modules PM1 and PM2, and the delivery unit 41. The transfer mechanism 31b of the transfer module TM2 can access the processing modules PM1, PM2, PM3, and PM4, and the delivery units 41 and 42. The transfer mechanism 31c of the transfer module TM3 can access the processing modules PM3, PM4, PM5, and PM6 and the delivery units 42 and 43. The transfer mechanism 31d of the transfer module TM4 can access the processing modules PM5, PM6, PM7, and PM8 and the delivery units 43 and 44. The transfer mechanism 31e of the transfer module TM5 can access the processing modules PM7, PM8, PM9, and PM10 and the delivery unit 44.

Figure 2:
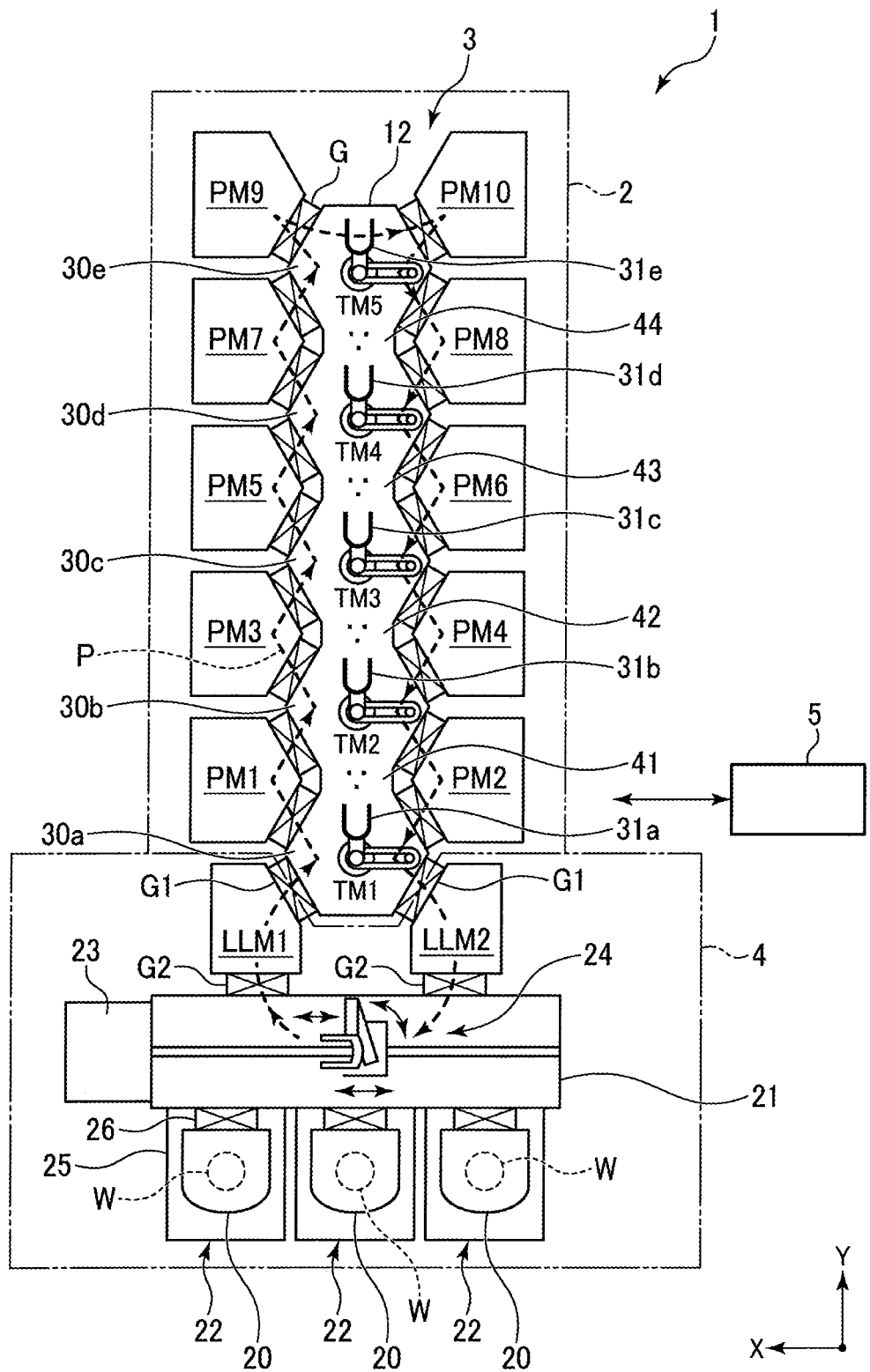
FIG. 2 is a schematic cross-sectional view showing a transfer path of a substrate in the substrate processing system according to the embodiment.

Since the transfer modules TM1 to TM5 and the atmospheric transfer device 24 of the transfer unit 3 are configured as described above, as shown in FIG. 2, the substrate W taken out from the FOUP 20 is transferred in a serial manner in one direction along a substantially U-shaped path P of the processing unit 2, processed in each processing module, and is returned to the FOUP 20. In other words, the substrate W is transferred in the order of processing modules PM1, PM3, PM5, PM7, PM9, PM10, PM8, PM6, PM4, and PM2, and subjected to predetermined processes in each processing module.

The substrate processing system 1 can be used for, e.g., manufacturing a laminated film (MTJ film) used for a magnetoresistive random access memory (MRAM). The process of manufacturing the MTJ film includes multiple processes such as pre-cleaning, film formation, oxidation, heat treatment, cooling, and the like, and each of such processes are performed in the processing modules PM1 to PM10.

Figure 3:
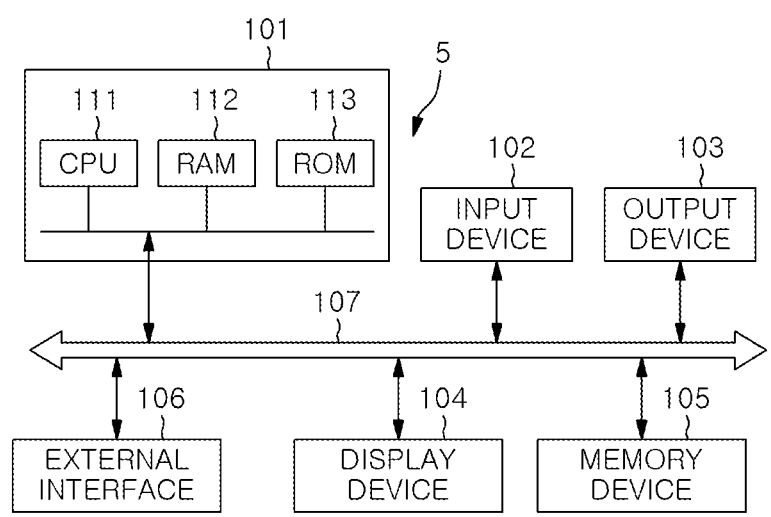
FIG. 3 is a block diagram showing an example of a hardware configuration of a controller in the substrate processing system according to the embodiment.

The controller 5 controls individual components of the substrate processing system 1, such as the transfer modules TM1 to TM5 (the transfer devices 31a to 31e) of the transfer unit 3, the atmospheric transfer device 24, the processing modules PM1 to PM10, the load-lock module LLM1 and LLM2, the transfer chamber 12, the gate valves G, G1, G2, and the like. The controller 5 is typically a computer. FIG. 3 shows an example of a hardware configuration of the controller 5. The controller 5 includes a main controller 101, an input device 102 such as a keyboard, a mouse, or the like, an output device 103 such as a printer or the like, a display device 104, a memory device 105, an external interface 106, and a bus 107 that connects the above components. The main controller 101 has a central processing unit (CPU) 111, a RAM 112, and a ROM 113. The storage device 105 is configured to record and read information required for control. The storage device 105 has a computer-readable storage medium, and the storage medium stores a processing recipe for processing the substrate W or the like.

In the controller 5, the CPU 111 uses the RAM 112 as a work area to execute a program stored in the storage medium of the storage device 105 or the ROM 113, thereby processing the substrate in the substrate processing system 1.

Figure 4:
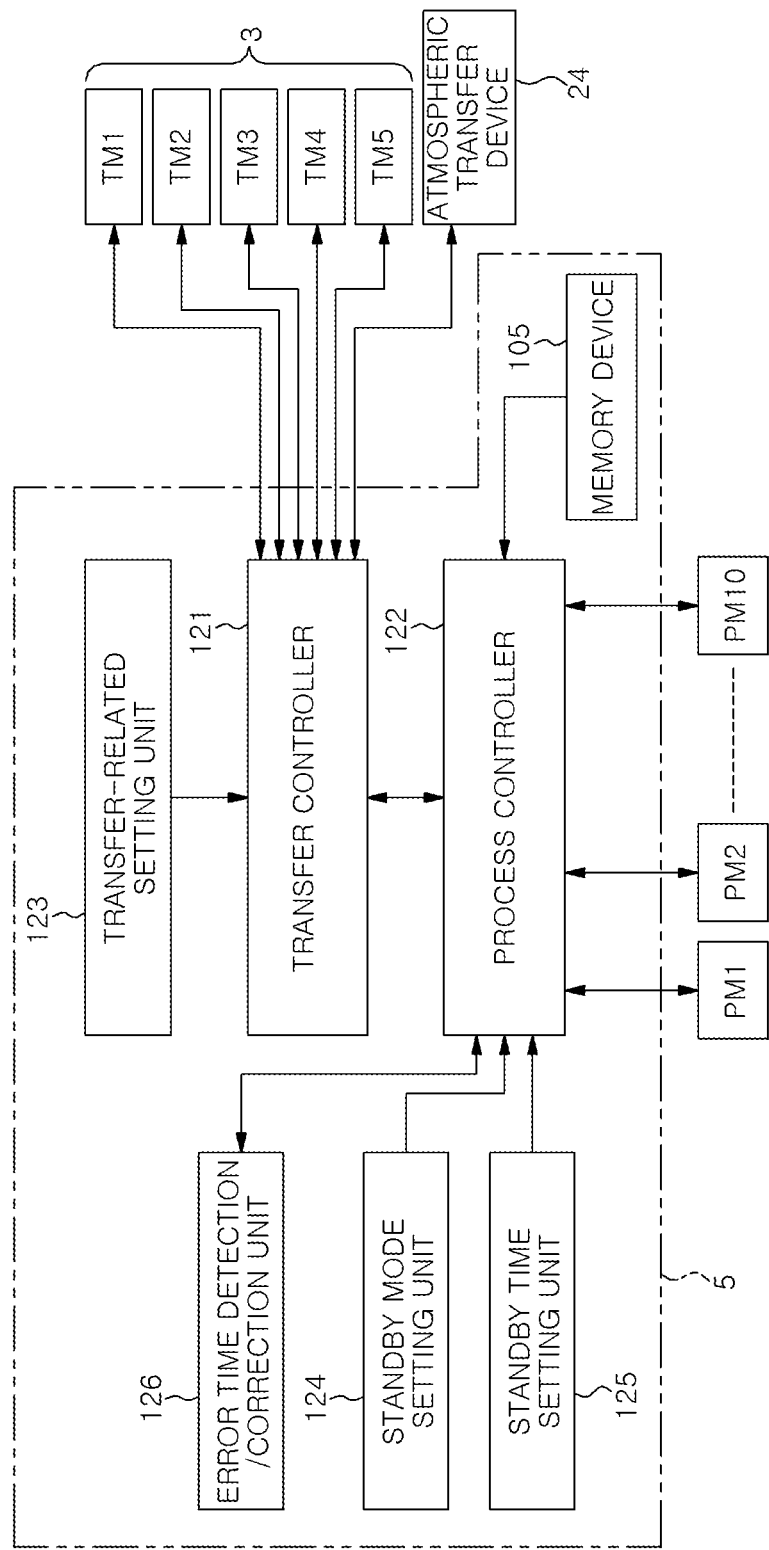
FIG. 4 is a functional block diagram of the controller in the substrate processing system according to the embodiment.

FIG. 4 is a functional block diagram of the controller 5. The controller 5 includes a transfer controller 121, a process controller 122, a transfer-related setting unit 123, a standby mode setting unit 124, a standby time setting unit 125, and an error time detection/correction unit 126. The transfer-related setting unit 123 is connected to the transfer controller 121. The standby mode setting unit 124, the standby time setting unit 125, and the error time detection/correction unit 126 are connected to the process controller 122. Although the controller 5 has other functional units, the description thereof will be omitted.

The transfer controller 121 controls the transfer modules TM1 to TM5 (the transfer devices 31a to 31e) and the atmospheric transfer device 24. Specifically, the substrate W is controlled to be unloaded from the FOUP 20 to reach the processing unit 2 via the aligner module 23 and the load-lock module LLM1, and then is sequentially transferred to the respective processing modules and is returned to the FOUP 20 via the load-lock module LLM2. The substrate W is not necessarily transferred along the transfer path passing through all the processing modules, and may be transferred along another transfer path such as a U-shaped transfer path whose direction is shifted at an intermediate processing module. The transfer controller 121 has a built-in timer.

The transfer controller 121 uses the past process time and the actual transfer time stored in the storage device 105 to predict a schedule at the start of transfer, and thereby generates a transfer schedule. In doing so, since the transfer devices of each transfer module correspond to the plurality of processing modules, the transfer schedule is generated to prevent the transfer device from being competitively used between the plurality of processing modules.

Figure 5:
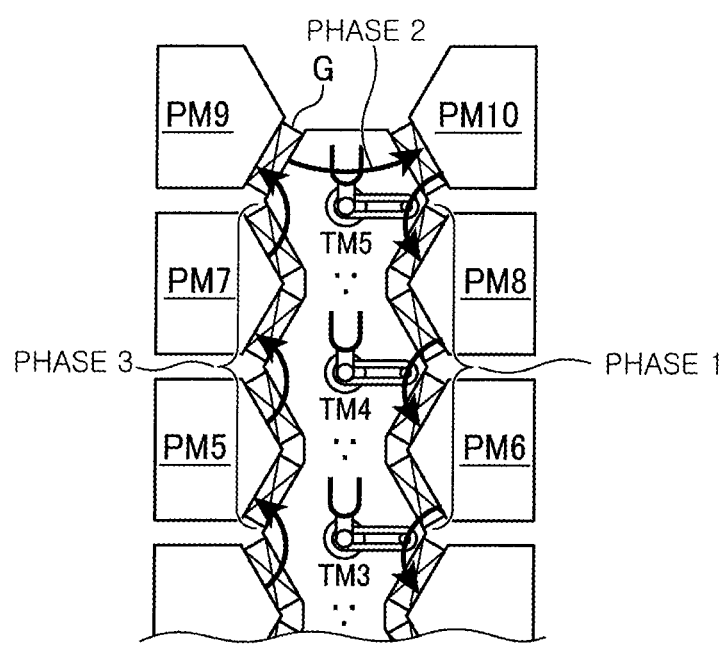
FIG. 5 explains an example of timing shift transfer.

According to the present embodiment, as a transfer control method, it is used, e.g., a method in which the series of transfer of a plurality of substrates W to the processing modules PM1 to PM10 is divided into a plurality of transfer phases, each being a basis of transfer, and a transfer timing is shifted for each transfer phase. Hereinafter, such transfer is referred to as "timing shift transfer." Specifically, as shown in FIG. 5, for example, a series of transfer is divided into three transfer phases of a right column, an intermediate column (the transfer from the processing module PM9 to the processing module PM10), and a left column. The substrate is first transferred in the right column of phase 1. Then, the substrate is transferred in the intermediate column of phase 2. Next, the substrate is transferred in the left column of phase 3. FIG. 5 shows a part of the processing unit 2. At this time, in phase 1 and phase 3, it is possible to transfer the substrates while synchronizing the plurality of transfer devices. The method of dividing the transfer phases and the number of transfer phases are not limited to the above examples. In order to perform the timing shift transfer, as will be described later, it is necessary to appropriately control a period of time in which the substrate W stays in each processing module.

The transfer-related setting unit 123 is configured to allow the transfer controller 121 to perform transfer-related setting such as setting of the transfer mode, e.g., a transfer path or the like, setting of the transfer phase, setting of an interval for unloading the substrate by the atmospheric transfer device 24, or the like.

The process controller 122 controls the processes of the processing modules PM1 to PM10 based on the processing recipe stored in the storage medium of the storage device 105. The processing modules PM1 to PM10 comprise individual controllers, and the process controller 122 controls the processing modules PM1 to PM10 via these controllers. Further, the process controller 122 controls the substrate W to stand by in each processing module to suppress the variation in a standby time until next processing due to a difference in duration of the processing time in each processing modules. The process controller 122 also has a built-in timer.

The standby mode setting unit 124 can set a standby period of the substrate W for each processing module at an appropriate timing depending on a content of the process. Specifically, the standby mode setting unit 124 is configured to select one of a plurality of standby modes in which the standby period is set at an appropriate timing depending on the content of the process of the processing module. The standby mode in which the timing of the standby period is set includes "post-processing standby mode," "pre-processing standby mode," and "immediate unloading mode (non-standby mode)."

Figure 6:
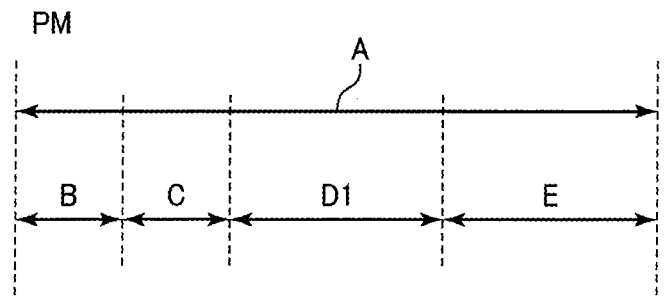
FIG. 6 shows a specific time chart of a processing module in a "post-processing standby mode"

In the "post-processing standby mode," the substrate W is made to standby in the processing module after the processing is performed. Such standby mode is applied to the processing module in which the standby of the substrate after the processing does not affect the processing. A specific time chart of the "post-processing standby mode" is as shown in FIG. 6. "A" indicates a cycle time that is a total time of the corresponding processing module, and proceeds in the order of a loading time B, a processing time C, a standby time D1, and an unloading time E.

Figure 7:
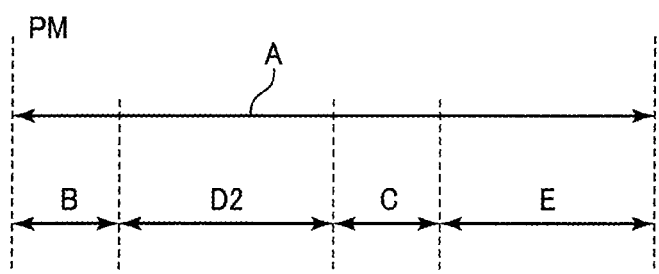
FIG. 7 shows a specific time chart of a processing module in a "pre-processing standby mode"

In the "pre-processing standby mode," the substrate W is made to standby in the processing module before processing is performed. Such standby mode is applied to a processing module in which the standby of the substrate after the processing affects temperature-dependent processing such as heating or cooling whereas the standby of the substrate before the processing does not affect the processing. A specific time chart of the "pre-processing standby mode" is as shown in FIG. 7. "A" indicates a cycle time that is a total time of the corresponding processing module, and proceeds in the order of a loading time B, a standby time D2, a processing time C, and an unloading time E.

Figure 8:
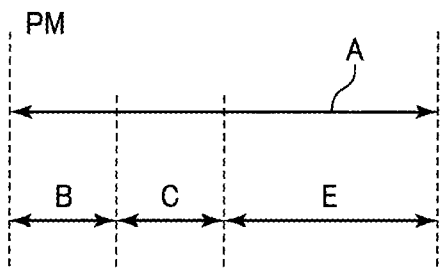
FIG. 8 shows a specific time chart of a processing module in an "immediate unloading mode (non-standby mode)"

In the "immediate unloading mode," the substrate W does not standby. This standby mode is applied to a processing module for performing processing, such as oxidation, whose characteristics are changed simply due to the standby of the substrate W in the processing module. The specific time chart of the "immediate unloading mode" is as shown in FIG. 8. "A" indicates a cycle time that is a cycle time that is a substrate standby time in the corresponding processing module, and proceeds in the order of a loading time B, a processing time C, and an unloading time E.

The standby time setting unit 125 sets the standby time when the standby mode set by the standby mode setting unit 124 is the "post-processing standby mode" or the "pre-processing standby mode." The standby time setting unit 125 sets the standby time for each processing module to optimize the cycle time that is the residence time of the substrate W in each processing module. The standby time may be automatically set by the transfer controller 121. The standby time can be set such that the cycle time becomes constant in the processing modules of the "post-processing standby mode" and the "pre-processing standby mode." Accordingly, it is easy to perform the above-described timing shift transfer in which the transfer timing is shifted for each transfer phase, and it is possible to effectively prevent the transfer devices from being competitively used. In this case, it is possible to set the cycle time of the processing module to be equal to the cycle time of the processing module having a longest processing time.

Further, when the timing shift transfer is performed in a state where the transfer is divided into the three transfer phases which are the right column, the intermediate column, and the left column as shown in FIG. 5, it is possible to shorten the cycle time by the amount of the transfer time (the amount of transfer shift) in the processing modules PM9 and PM10 adjacent to the transfer module TM5 where the transfer is returned.

Since the processing module in the "immediate unloading mode" has no standby time for the substrate W, the standby time cannot be adjusted. However, the substrate transfer can be optimized by adjusting the standby time on the transfer device that unloads the substrate and the standby time for the next processing module.

The error time detection/correction unit 126 has a function of detecting an error time ("shift") with respect to a schedule of processing and/or transfer of the substrate W that occurs in each processing module and correcting the error time. In the actual transfer of the substrate W, the error time with respect to an initially created schedule may be caused by a transfer error or a non-uniform processing time due to plasma ignition retry or the like in the plasma processing. If such an error time occurs, desired transfer of the substrate W cannot be performed. The error time detection/correction unit 126 can correct such an error time by detecting an error time of the substrate in the processing module and transmitting a signal for correcting the error time to the transfer controller 121. The error time can be detected after the completion of loading of the substrate into the processing module, after the completion of the processing of the substrate in the processing module, and after the completion of the unloading of the substrate from the processing module.

Figure 9:
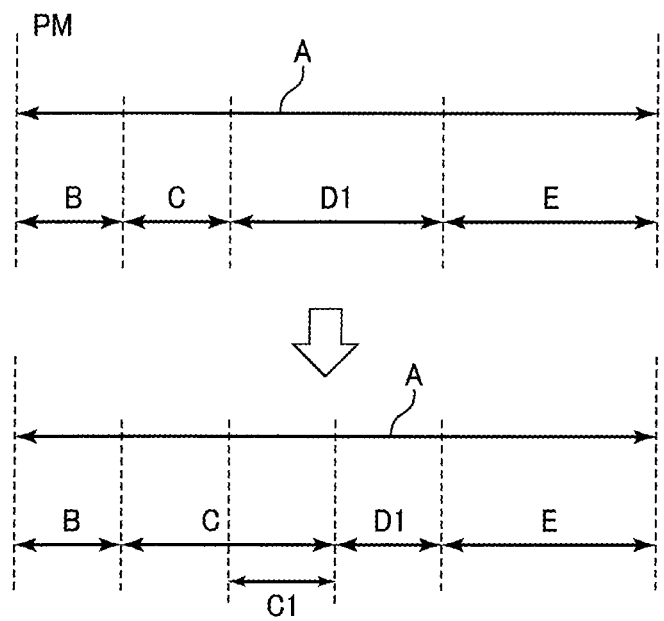
FIG. 9 shows an example of correction of an error time in the processing module in the "post-processing standby mode"
Figure 10:
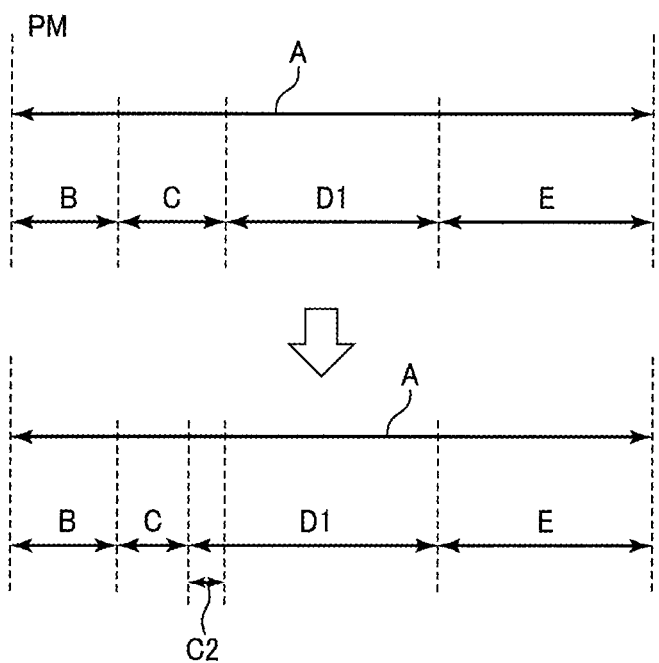
FIG. 10 shows another example of correction of the error time in the processing module in the "post-processing standby mode"

In the processing module of the "post-processing standby mode," the error time can be corrected by shortening or extending the standby time of the substrate W depending on the error time. For example, when the processing time is longer than the scheduled time of the processing recipe, the standby time D1 can be shortened by an extended time C1 as shown in FIG. 9. On the contrary, when the processing time is shorter than the scheduled time of the processing recipe, the standby time can be extended by a shortened time C2 of the processing time as shown in FIG. 10. When the extended time of the processing time is longer than the standby time, the error time can be corrected at the next correction timing (correction timing in the transfer module for unloading the substrate or the next processing module).

In the processing module of the "pre-processing standby mode," when the processing time is shortened or extended, the error time cannot be corrected by adjusting the standby time of the substrate, but can be corrected at the next correction timing (correction timing in the transfer module for unloading the substrate or in the next processing module).

Figure 11:
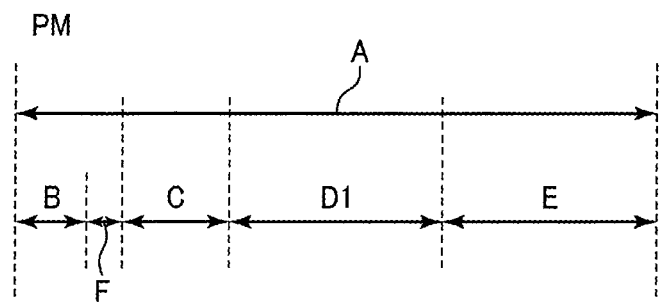
FIG. 11 shows an example of correction of the error time in the case where a loading time ends earlier than expected.
Figure 12:
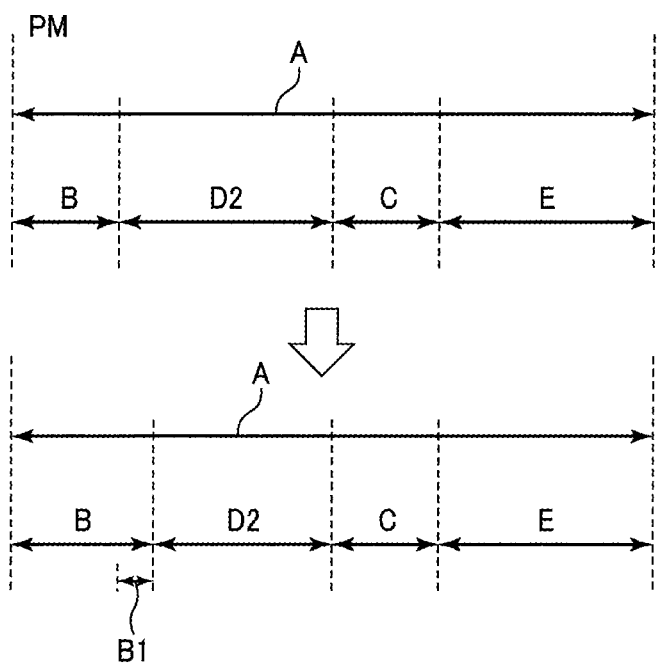
FIG. 12 shows an example of correction of the error time in the case where the loading time ends later than expected in the processing module in the "pre-processing standby mode"

When the loading time ends earlier than expected, the error time can be corrected by providing a standby time F before the processing as shown in FIG. 11 regardless of the standby mode. When the loading time ends later than expected, in the "pre-processing standby mode," the pre-processing standby time is shortened by a delayed time B1 as shown in FIG. 12. When the delayed time exceeds the pre-processing standby time, the delayed time can be corrected at the next correction timing. When the loading time ends later than expected in the "post-processing standby mode," the error time can be corrected at the next correction timing.

Figure 13:
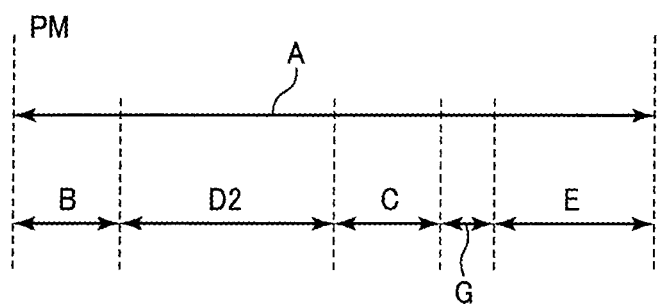
FIG. 13 shows an example of correction of the error time in the case where an unloading time ends earlier than expected.

When the unloading time ends earlier than expected, the standby time G corresponding to the shortened time is provided in the transfer module as shown in FIG. 13. When the unloading time ends later than expected, the error time can be corrected at the next correction timing.

In the processing module of the "immediate unloading mode," there is no standby time in the processing module, and thus, it is not possible to correct the time in the processing module. In this case, the time can be corrected using the standby time of the subsequent processing module.

However, when the processing of a "certain substrate" is delayed in the processing module of the "immediate unloading mode," if the "next substrate" is immediately transferred to the processing module, the next processing module may not be empty when the processing of the "next substrate" in the corresponding processing module ends, so that the "next substrate" cannot be unloaded. For example, it is assumed that the substrate W is transferred along a transfer path of the processing module PM1→the transfer module TM2 (the transfer device 31*b*)→the processing module PM3→the transfer module TM3 (the transfer device 31*c*)→the processing module PM5, and the processing module PM3 is in the "immediate unloading mode." The processing time of the processing recipe in the processing module PM3 is set to 200 seconds, and the time in which the processing recipe should be executed in the processing module PM5 at the time of starting the processing module PM3 is set to 50 seconds. Under such conditions, for example, when the processing time of the processing module PM3 is delayed by 50 seconds, if the "next substrate" is immediately transferred from the processing module PM1 to the processing module PM3, the processing module PM5 is not empty unless 250 seconds elapses. Therefore, the "next substrate" cannot be unloaded to the processing module PM5. In that case, the "next substrate" is made to standby in the processing module PM1 or the transfer module TM2, and is transferred to the processing module PM3 when it is determined that the processing recipe of the processing module PM5 is executed for a predetermined period.

The adjustment of the standby time using the previous processing module can also be adopted in the processing modules PM9 and PM10 in which the period of time in which the substrate stays (cycle time) is shortened at the time of performing the timing shift transfer as described above.

Next, the processing operation in the substrate processing system 1 configured as described above will be described. The following processing operations are executed under the control of the controller 5.

First, the substrate W is taken out from the FOUP 20 on the load port 22 and transferred to the aligner module 23 by the atmospheric transfer device 24. After the substrate W is aligned by the aligner module 23, the substrate W is taken out from the aligner module 23 and transferred to the load-lock module LLM1 by the atmospheric transfer device 24. At this time, the load-lock module LLM1 is maintained in an atmospheric pressure, and is evacuated after the substrate W is received.

Then, the substrate W is taken out from the load-lock module LLM1 and transferred to the processing module PM1 by the transfer mechanism 31*a* of the transfer module TM1 in the transfer unit 3. Next, the substrate W is subjected to the predetermined process in the processing module PM1. Thereafter, the substrate W is sequentially transferred to the processing modules PM3, PM5, PM7, PM9, PM10, PM8, PM6, PM4, PM2 by the transfer mechanisms 31*a* to 31*e* of the transfer modules TM1 to TM5, and is sequentially subjected to predetermined processing in these processing modules. After the processing of the substrate W in the processing module PM2 is completed, the substrate W is transferred to the load-lock module LLM2 by the transfer mechanism 31*a* of the transfer module TM1. At this time, the load-lock module LLM2 is maintained in a vacuum state, and is opened to the atmosphere after the substrate W is received.

Thereafter, the substrate W in the load-lock module LLM2 is transferred into the FOUP 20 of the load port 22 by the atmospheric transfer device 24.

The above-described series of processes are repeatedly performed on a plurality of substrates W.

Conventionally, in the transfer system of this type of the substrate processing system, the transfer efficiency has been considered to be important and a plurality of substrates has been controlled to be consecutively transferred within the shortest time by trigger transfer.

However, the processing times in each of the processing modules are not constant, and even if a first substrate can be transferred without a standby time, a second and subsequent substrates should standby in the previous processing module of the processing module having a long recipe time. Accordingly, different process results may be obtained.

For example, a process of manufacturing an MTJ film of an MRAM includes a plurality of processes such as pre-cleaning, film formation, oxidation, heating, cooling, and the like. Therefore, the second and subsequent substrates standby in the processing modules PM1, PM3, and PM5 until the processing of the previous substrate in the processing module PM7 is completed.

At this time, if the processing performed on the substrate in the standbying processing modules PM1, PM3, and PM5 is the processing such as oxidation, cooling, or the like, in which the state of the substrate may be changed during the standby, the first substrate and the second and subsequent substrates may have different thermal histories, such that the different process results may be obtained.

Japanese Patent Application Publication No. 2020-9837 discloses, as a technique for solving such problem without decreasing the throughput, a technique for setting a desired period interval between the time when the substrate is unloaded from the loading/unloading unit and the time when the next substrate is unloaded.

However, the technique disclosed in Japanese Patent Application Publication No. 2020-9837 does not perform adjustment in the processing module basis, and thus, when unexpected substrate standby occurs due to an error or sudden delay in the processing module during a series of processing, it may be difficult to sufficiently suppress the non-uniformity of the processing. Further, when the transfer of the substrate is disturbed due to the error or the sudden delay in the processing module, the transfer device may be competitively used by a plurality of processing apparatuses. Accordingly, the substrate needs to standby again, which results in decrease of the uniformity of the processing or throughput.

Therefore, according to the present embodiment, the controller 5 controls the standby mode setting unit 124 to set the standby period of the substrate W at an appropriate timing depending on the content of the process for each processing module. Specifically, the standby mode setting unit 124 has a plurality of standby modes in which a standby period is set at an appropriate timing depending on the content of process of the processing module, and can select any one of the standby modes. The "post-processing standby mode," the "pre-processing standby mode," and the "immediate unloading mode (non-standby mode)" are set as the standby modes, and any one of the standby modes can be selected.

Accordingly, a buffer for substrate transfer can be obtained without affecting the processing of the substrate W in each processing module, and it is possible to suppress the stay of the substrate in the previous processing module of the processing module having a long processing time. Therefore, the non-uniformity of the substrate processing can be effectively suppressed while maintaining high throughput. Further, in a processing module for performing processing, such as oxidation, in which the process characteristics are changed simply due to the standby of the substrate W in the processing module, the "immediate unloading mode" which has no standby of the substrate can be set to suppress the non-uniformity of the substrate processing.

In this case, since the substrate standby time in the processing module can be set by the standby time setting unit 125, the cycle time that is a period of time in which the substrate stays in each processing module can be optimized, and the cycle time can be set to be constant for the plurality of processing modules.

Further, since the error time detection/correction unit 126 can detect the error time ("shift") with respect to the schedule in the processing module and correct the error time, the stay of the substrate W can be significantly and effectively suppressed even when the error time occurs in the processing module. In the processing module of the "immediate unloading mode," there is no standby time in the processing module, and thus, the time cannot be corrected in the corresponding processing module. However, the time can be corrected using the standby time of the subsequent transfer module or the subsequent processing module. Further, when the processing of "a certain substrate" is delayed in the processing module of the "immediate unloading mode," the stay of the next substrate can be suppressed by delaying the loading into the previous processing module of the corresponding processing module by the delayed time in the processing of the "next substrate."

According to the present embodiment, in order to solve the above problem, series of transfer of the plurality of substrates W to the processing modules PM1 to PM10 by the transfer devices 31a to 31e are divided into a plurality of transfer phases, each being a basis of transfer, and the timing shift transfer in which the transfer timing is shifted for each transfer phase is performed. For example, as shown in FIG. 5, a series of transfer is divided into three transfer phases which are a right column, an intermediate column (the transfer from the processing module PM9 to the processing module PM10), and a left column. The substrate is first transferred in the right column of phase 1. Then, the substrate is transferred in the intermediate column of phase 2. Next, the substrate is transferred in the left column of phase 3.

Accordingly, the transfer device can access the plurality of processing modules at different timings, which makes it possible to effectively suppress the transfer device from being competitively used by the plurality of processing modules.

In this case, it is possible to make each transfer timings uniform in the respective transfer phases by allowing the standby time setting unit 125 to set the substrate standby time such that the cycle time, that is a period of time in which the substrate stays in each processing module, is optimized. In particular, by making the cycle times of the plurality of processing modules constant, it is easy to make the transfer timings equal in the respective transfer phases. However, in the processing modules PM9 and PM10 adjacent to the transfer module TM5 in which the transfer is returned, it is possible to shorten the cycle time by the shift of the transfer time in order to perform the timing shift transfer. Further, although there is no standby time in the processing module in the "immediate unloading mode," it is possible to cope with shift transfer by adjusting the standby time on the transfer device that has unloaded the substrate W and the standby time in the next processing module.

In the processing module of the "immediate unloading mode" or the processing module in which the cycle time is shortened to perform the timing shift transfer, when the processing of the substrate in the processing module is delayed, it is possible to make the "next substrate" standby in the previous processing module or the previous transfer module. Accordingly, even if the processing in the corresponding processing module is delayed and the "next substrate" is immediately transferred to the corresponding processing module, it is possible to prevent a situation that the next processing module is not empty after the processing in the corresponding processing module is completed.

As described above, in accordance with the present embodiment, the standby mode setting unit 124 can set the standby period of the substrate W at an appropriate timing depending on the content of the process for each processing module. Accordingly, it is possible to prevent the substrate from staying in the previous processing module of the processing module having a long processing time without affecting the processing of the substrate W in each processing module, and it is also possible to effectively suppress the non-uniformity of the substrate processing while maintaining high throughput. Further, series of transfer of a plurality of substrates to a plurality of processing modules by a transfer device is divided into a plurality of transfer phases, each being a basis of transfer, and the timing shift transfer in which the transfer timing is shifted for each transfer phase is performed. Hence, the transfer device can access the plurality of processing modules at different timings, which makes it possible to suppress the transfer device from being competitively used by the plurality of processing modules.

While the embodiments have been described above, the embodiments of the present disclosure are illustrative in all respects and are not restrictive. The above-described embodiments may be omitted, replaced, or changed in various forms without departing from the scope of the appended claims and the gist thereof.

For example, the substrate processing system 1 of the present embodiment is merely an example, and any substrate may be sequentially transferred to a plurality of processing modules in a serial manner. Further, although the process of manufacturing of the MTJ film of MRAM has been described as an example of the processing, the present disclosure is not limited thereto.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A substrate processing system for performing processing on a plurality of substrates, comprising:
a processing unit comprising a plurality of processing modules each configured to perform a predetermined process;
a transfer unit having a transfer device configured to transfer a substrate to each of the plurality of processing modules;
a loading/unloading unit configured to hold a plurality of substrates and load/unload a substrate to/from the processing unit; and
a controller configured to control the processing unit, the loading/unloading unit, and the transfer unit,
wherein the controller controls the transfer unit to transfer to the plurality of processing modules in a serial manner a plurality of substrates that are sequentially loaded from the loading/unloading unit to the processing unit, the controller further comprises a standby mode setting unit configured to select any one of multiple standby modes in which a standby period is set at an appropriate timing depending on the content of the process of the processing module, and
wherein the multiple standby modes comprise a post-processing standby mode in which the substrate stands by in the processing module after the substrate is processed in the processing module, a pre-processing standby mode in which the substrate stands by in the processing module before the substrate is processed in the processing module, and a no-standby mode in which the substrate does not stand by in the processing module.

2. The substrate processing system of claim 1, wherein the controller comprises a standby time setting unit configured to set a standby time for each processing module.

3. The substrate processing system of claim 2, wherein the standby time setting unit sets the standby time such that a period of time in which the substrate stays in the processing module becomes constant for the plurality of processing modules.

4. The substrate processing system of claim 2, wherein the controller comprises an error time detection/correction unit having a function of detecting an error time with respect to a schedule of processing and/or transfer of the substrate for each processing modules and correcting the error time.

5. The substrate processing system of claim 4, wherein the error time detection/correction unit corrects the error time by shortening or extending the standby time depending on the error time of the processing module.

6. The substrate processing system of claim 4, wherein when the error time is not correctable in a processing module, the error time detection/correction unit corrects the error time via a transfer device that unloads a substrate from the processing module or via the next processing module.

7. The substrate processing system of claim 4, wherein when the processing time of a certain substrate is extended in the processing module which cannot correct the error of the processing time, the error time detection/correction unit stands by the next substrate for a period of time corresponding to the extended amount of the processing time when loading the next substrate into the processing module.

8. A substrate processing system for processing a plurality of substrates, comprising:
a processing unit having a plurality of processing modules each configured to perform a predetermined process;
a transfer unit configured to transfer a substrate to each of the plurality of processing modules;
a loading/unloading unit configured to hold a plurality of substrates and load/unload the substrate to/from the processing unit; and
a controller configured to control the processing unit and the transfer unit,
wherein the transfer unit comprises a transfer chamber and a plurality of transfer devices arranged in a row in the transfer chamber,
the plurality of processing modules are connected to both sides of the transfer chamber, and
wherein the controller controls the transfer unit to sequentially transfer to the plurality of processing modules in a serial manner a plurality of substrates unloaded from the loading/unloading unit to the processing unit, wherein the controller further controls the transfer unit such that series of transfers of the plurality of substrates to the plurality of processing modules are divided into a plurality of transfer phases, each being a basis of transfer, and the transfer timing is shifted to each transfer phase, and wherein the controller controls the transfer unit to transfer the substrate loaded from the loading/unloading unit into the processing unit in a U shape from a processing module at one end of the transfer chamber to a processing module at the other end of the transfer chamber, and sets, as the plurality of transfer phases, a row of processing modules on one side of the transfer chamber, a row of processing modules on the other side of the transfer chamber, and a row of intermediate processing modules.

9. The substrate processing system of claim 8, wherein the controller comprises a standby mode setting unit configured to set a standby time of a substrate at an appropriate timing depending on a content of the process for each of the plurality of processing modules, and a standby time setting unit configured to set the standby time, wherein the standby time setting unit is configured to set the standby time such that a period of time in which the substrate stays in the processing module becomes constant for the plurality of processing modules.

10. The substrate processing system of claim 8, wherein the controller comprises a standby mode setting unit configured to set a standby time of a substrate at an appropriate timing depending on the content of the process for each of the plurality of processing modules, and a standby time setting unit configured to set the standby time, wherein the standby time setting unit is configured to set the standby time such that the period of time in which the substrate stays in the processing modules other than the intermediate processing modules becomes constant and such that the period of time in which the substrate stays in the intermediate processing modules becomes shorter than the period of time in which the substrate stays in the other processing modules by the amount of transfer shift.

11. A substrate processing method for processing a substrate in a substrate processing system comprising a processing unit having a plurality of processing modules each configured to perform a predetermined process, a transfer unit having a transfer device configured to transfer a substrate to each of the plurality of processing modules, and a loading/unloading unit configured to hold a plurality of substrates and load/unload a substrate to/from the processing unit, the method comprising:

selecting any one of multiple standby modes in which a standby period is set at an appropriate timing depending on the content of the process of the processing module;

sequentially loading the plurality of substrates from the loading/unloading unit to the processing unit; and sequentially transferring the plurality of substrates that are sequentially loaded into the processing unit to the plurality of processing modules in a serial manner and processing the substrates, wherein the multiple standby modes comprise a post-processing standby mode in which the substrate stands by in the processing module after the substrate is processed in the processing module, a pre-processing standby mode in which the substrate stands by in the processing module before the substrate is processed in the processing module, and a no-standby mode in which the substrate does not stand by in the processing module.

12. A non-transitory computer readable medium having stored thereon a control program that operates on a computer and controls processing of a substrate in a substrate processing system comprising a processing unit having a plurality of processing modules each configured to perform a predetermined process, a transfer unit having a transfer device configured to transfer a substrate to each of the plurality of processing modules, and a loading/unloading unit configured to hold a plurality of substrates and load/unload a substrate to/from the processing unit, wherein the control program, when executed, causes a computer to control the substrate processing system to perform the acts of:

selecting any one of multiple standby modes in which a standby period is set at an appropriate timing depending on the content of the process of the processing module;

sequentially loading the plurality of substrates from the loading/unloading unit to the processing unit; and sequentially transferring the plurality of substrates that are sequentially loaded into the processing unit to the plurality of processing modules in a serial manner and processing the substrates, wherein the multiple standby modes comprise a post-processing standby mode in which the substrate stands by in the processing module after the substrate is processed in the processing module, a pre-processing standby mode in which the substrate stands by in the processing module before the substrate is processed in the processing module, and a no-standby mode in which the substrate does not stand by in the processing module.

* * * * *